(12) United States Patent
Hinrichs et al.

(10) Patent No.: US 7,183,956 B1
(45) Date of Patent: Feb. 27, 2007

(54) HIGH SPEED DIGITAL DELTA-SIGMA MODULATOR WITH INTEGRATED UPSAMPLER

(75) Inventors: Jeffrey M. Hinrichs, San Diego, CA (US); Harry S. Harberts, San Marcos, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 11/202,307

(22) Filed: Aug. 10, 2005

(51) Int. Cl.
    *H03M 3/02* (2006.01)
(52) U.S. Cl. .................................. 341/143; 341/61
(58) Field of Classification Search ............ 341/61, 341/143
    See application file for complete search history.

(56) References Cited

U.S. PATENT DOCUMENTS

| | | | |
|---|---|---|---|
| 5,701,106 A * | 12/1997 | Pikkarainen et al. ........ | 332/100 |
| 6,703,954 B2 * | 3/2004 | Alelyunas et al. .......... | 341/144 |
| 2003/0179831 A1 * | 9/2003 | Gupta et al. ................ | 375/296 |
| 2004/0192229 A1 * | 9/2004 | Morris et al. ............... | 455/91 |
| 2004/0263365 A1 * | 12/2004 | Robinson et al. .......... | 341/77 |
| 2005/0085194 A1 * | 4/2005 | Robinson et al. .......... | 455/91 |
| 2005/0162294 A1 * | 7/2005 | Norsworthy et al. ....... | 341/136 |

* cited by examiner

*Primary Examiner*—Howard L. Williams
(74) *Attorney, Agent, or Firm*—Tarolli, Sundheim, Covell & Tummino LLP

(57) ABSTRACT

Apparatus, and a related method, for converting digital signals directly to radio-frequency (RF) analog signals. The apparatus includes a single high-speed delta-sigma modulator and an integrated upsampler that increases the data rate of digital input samples by a selected factor, such as nine times. The delta-sigma modulator is configured to include a feedback multiplier coefficients that are selected to greatly facilitate operation of associated adders. At least one critical adder includes a carry-select adder modification that further speeds up the add operation and ensures that the apparatus operates at desirably high frequencies.

15 Claims, 5 Drawing Sheets

HIGH SPEED DIGITAL DELTA-SIGMA MODULATOR WITH INTEGRATED UPSAMPLER

CROSS-REFERENCE TO RELATED APPLICATION

This invention is related to U.S. patent appln. Ser. No. 10/109,834, filed Mar. 29, 2002, by Jeffrey M. Hinrichs et al., entitled "Apparatus and Methods for Digital-to-Analog Conversion," published Oct. 2, 2003 as Pub. No. US 2003/0185288 A1, and assigned to the same assignee as the present invention.

BACKGROUND OF THE INVENTION

This invention relates generally to radio-frequency (RF) transmitters and, more particularly to high-speed digital processing techniques used in RF transmitters. As in other applications of electronics, digital signal processing is widely used in communications and specifically in RF transmitters. Because signals in digital form are less prone to inaccuracies than analog signals, it is desirable to maintain signals to be transmitted in the digital domain for as long as possible before converting them to analog form for coupling to an antenna. Most RF transmitters in use today still require one or more states of analog upconversion, in which signals modulating an RF carrier are transformed to equivalent signals modulating an RF carrier of higher frequency. Because analog RF upconversion stages are inherently subject to inaccuracies, there is a need for a digital-to-analog converter that can place the modulated signals at the desired final carrier frequency without using any stages of analog upconversion.

An inherent difficulty in performing direct-to-RF digital-to-analog conversion is that the data rate at the input to the digital-to-analog converter (DAC) must be very high, making it difficult to interface with a standard baseband digital processor, which typically operates at lower frequencies. Therefore, the DAC must be able to accept data at reasonable rates, such as in the low hundreds of megahertz (MHz), but transform these data to a much higher rate for the desired conversion to analog form.

One approach to a direct-to-analog DAC architecture is disclosed in pending patent Application Ser. No. 10/109,834, entitled "Apparatus and Methods for Digital-to-Analog Conversion," by Jeffrey M. Hinrichs et al., filed Mar. 29, 2002 and published Oct. 2, 2003 as Pub. No. US 2003/0185288 A1. The disclosure of the Hinrichs et al. application is incorporated by reference into this specification.

The prior application of Hinrichs et al. discloses apparatus with an oversampling circuit, a low-speed delta-sigma loop, at least one additional, higher-speed delta-sigma loop, and a high-speed tuning circuit that effects digital upconversion before input to a DAC. The apparatus also includes an upsampling circuit disposed between the first two delta-sigma loops, to increase the data rate of the signal by a process of sample repetition. A delta-sigma modulator loop has the effect of reducing the number of bits of resolution of digital samples applied to it. A delta-sigma loop includes a succession of digital multipliers and adders to perform its function. Necessarily, the earlier multipliers in the loop have to process digital samples of high resolution, which is to say larger digital word lengths. Since processing speed is always an important issue, it is often the speed of the earlier multipliers in a delta-sigma loop that limits the frequency of operation of the overall circuit. In the prior application of Hinrichs et al., delta-sigma modulation and filtering was split into two stages, the first of which was able to operate at a lower speed, to reduce the sample resolution from 18 bits to 13 bits. Following upsampling, the second stage performed further low-pass filtering and reduced the sample resolution from 13 bits to a one-bit resolution for digital-to-analog conversion. While this configuration operates satisfactorily, there is a need for a simpler approach to direct-to-RF digital-to-analog conversion that does not require two stages of delta-sigma modulation. The present invention satisfies this need.

SUMMARY OF THE INVENTION

The present invention resides in a direct-to-RF digital-to-analog conversion apparatus comprising a digital upsampler and a single delta-sigma modulator, and in a related method for its operation. Briefly, and in general terms, the invention may be defined as apparatus for converting digital input signals directly to a radio-frequency (RF) analog signal for transmission, without use of RF upconversion. The apparatus comprises an upsampler, for taking the digital input signals at input sample rate and converting them by interpolation to upsampled digital input signals at a rate greater than the input sample rate; a delta-sigma modulator for receiving the upsampled digital input signals and transforming them to output digital signals having a lower resolution than the digital input signals; and a digital-to-analog converter, for converting the output digital signals to RF analog form for transmission.

More specifically, the upsampler generates upsampled digital signals at a sample rate of N times the input sample rate, and comprises a multiplexer having N inputs and a single output; combinatorial logic for manipulating two consecutive digital input signals and applying selected positive or negative versions of the two consecutive signals to the N inputs of the multiplexer; and a counter coupled to the multiplexer and configured to generate cyclically control signals of values 1 through N, at a rate N times the input sample rate. The multiplexer, therefore, outputs a succession of upsampled digital signals selected from each multiplexer input in turn, at a rate of N times the input sample rate. The combinatorial logic has the effect of inserting (N−1) zero-valued new samples between each two consecutive digital input signals, and subsequently filtering the resulting signal stream to provide the upsampled digital input signals.

In the presently preferred embodiment of the invention, the delta-sigma modulator comprises a plurality of adders; a plurality of sample delay circuits; and a plurality of feedback paths that include numerical coefficients as multipliers. In accordance with one aspect of the invention, at least some of the numerical coefficients are selected because the binary representations of the coefficients greatly simplify digital multiplication by these coefficients. In particular, the selected coefficients have groupings of a few "1" digits on one end of the binary form of the coefficients.

In accordance with another aspect of the invention, at least one of the plurality of adders in the delta-sigma modulator comprises a first carry ripple adder that handles a first segment of n bits of digital quantities being added; and second and third carry ripple adders that both handle, in parallel, a second segment of m bits of the digital quantities being added, where n+m is greater than B, the total number of bits in each digital quantity being added, and where the second and third carry ripple adders have fixed values of 0 and 1 carry input bits, respectively. The adder further comprises a multiplexer with two inputs for receiving respective outputs in (B-n) bit positions from the second and third carry ripple adders, and with a control input for receiving a control signal derived from a carry value generated at the (B-m)th bit position of the first carry ripple adder. The multiplexer selects the appropriate one of the second or third carry ripple adder outputs in the (B-n) bit positions, and this output is combined with the n-bit output of the first carry ripple adder as soon as it becomes available and without being subject to a multiplexer delay.

More specifically, at least one adder is a 15-bit adder (B=15); the first carry ripple adder handles a segment of 10 bits (n=10); the second and third carry ripple adders each handle a segment of 7 bits (m=7) and output the five (B-n) most significant bits to the multiplexer. The multiplexer is controlled by a carry signal from the 8th or (B-m)th bit position of the first carry ripple adder, which selects the multiplexer output two bit cycles before the first carry ripple adder completes its 10-bit add operation, thereby compensating for the multiplexer delay in the add operation.

The invention may also be defined in terms of a method for converting digital input signals directly to a radio-frequency (RF) analog signal for transmission, without use of RF upconversion. Briefly, the method comprises the steps of upsampling the digital input signals by converting them from input sample rate to upsampled digital input signals at a rate greater than the input sample rate; then, in a delta-sigma modulator, receiving the upsampled digital input signals and transforming them to output digital signals having a lower resolution than the digital input signals; and, finally, converting the output digital signals to RF analog form for transmission.

It will be appreciated from the foregoing summary that the present invention represents a significant advance in direct-to-RF digital-to-analog conversion. In particular, the invention provides for direct-to-RF conversion in a configuration that can be conveniently implemented in a single integrated circuit. Other aspects and advantages of the invention will become apparent from the following more detailed description, taken in conjunction with the accompanying drawings.

DETAILED DESCRIPTION OF THE INVENTION

Figure 1:
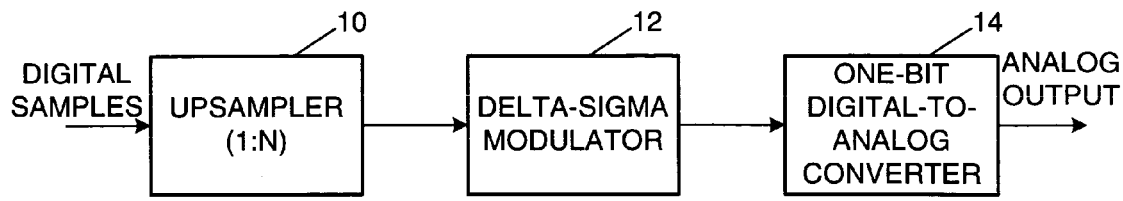
FIG. 1 is a simplified block diagram of a direct-to-RF digital-to-analog conversion circuit in accordance with the present invention.

As shown in the drawings, the present invention is concerned with circuitry for converting baseband digital signals directly to radio-frequency analog signals for transmission. Conventionally, RF transmitters require one or more stages of analog frequency upconversion to translate a modulated signal up to a desired carrier frequency prior to transmission through an antenna. Errors and inaccuracies that are inherent in RF analog processing dictate that it is desirable to keep the modulated signal in the digital domain as long as possible, without any stages of analog upconversion before conversion of the modulated signal to analog form. Ideally, therefore, direct-to-RF digital-to-analog circuitry would be preferred in many communication applications but there are practically difficulties in the design of such a system.

Implementation of a direct-to-RF converter necessarily requires an extremely high data rate at the input of the digital-to-analog converter (DAC), making it difficult to interface with a standard baseband signal digital processor. The implementation must be able to accept baseband signals at reasonably low rates, such as in the low hundreds of megahertz (MHz), and provide data input to the DAC at a much higher rate. Necessarily, such an implementation has to perform high-speed digital signal processing operations, including addition, multiplication and storage of digital samples. These operations are typically time-intensive and effectively limit the speed of operation of any direct-to-RF conversion circuitry.

In accordance with the present invention, direct-to-RF conversion is effected by circuitry that includes an upsampler 10, as shown in FIG. 1, a delta-sigma modulator 12 and a one-bit digital-to-analog converter 14. When used to process the digital output from the delta-sigma modulator 12, the one-bit D/A converter 14 provides a two-state analog output, which, when appropriately filtered, accurately reflects the value of a multi-bit signal that is input to the delta-sigma modulator. The upsampler 10 receives multi-bit input samples at a rate of typically hundreds of megasamples per second (MS/s) and generates output samples with the same number of bits of resolution, but at a rate that is N times the input rate.

In the more specific block diagram of the upsampler 10, the input data rate is 317 MS/s and each sample has a 12-bit length. The upsampling rate N is 9, and the upsampler 10 generates a stream of 12-bit output samples at a rate of 2,853 MS/s. Upsampling is a form of interpolation, where no information is added to the signals but the data rate is increased. Various upsampling techniques are available but the one used and presently preferred in the invention involves adding zero-value samples between the input samples and then filtering the resulting data stream. These functions are implemented by the combinatorial logic shown in FIG. 2. Each input sample is first split at junction point 20 into two paths, one of which passes through a delay circuit 22. The undelayed path is further split into five paths, which are connected, respectively, to the first, third, fifth, seventh and ninth inputs of a 9:1 multiplexer 24. The inputs to the third and seventh inputs of the multiplexer 24 are negated (multiplied by −1) before being applied to the multiplexer. The delayed path out of the delay circuit 22 is further split into four paths, which are connected, respectively to the second, fourth, sixth and eighth inputs to the multiplexer 24. The inputs to the second and sixth inputs are negated (multiplied by −1). The multiplexer 24 is controlled by a signal from a counter 26, which counts cyclically from 1 to 9 at a rate of 2,853 MHz (the sample output rate of the multiplexer). Thus the multiplexer 24 generates 12-bit output samples at a 2,853 MS/s rate, by selecting each of the multiplexer input signals in turn.

Figure 2:
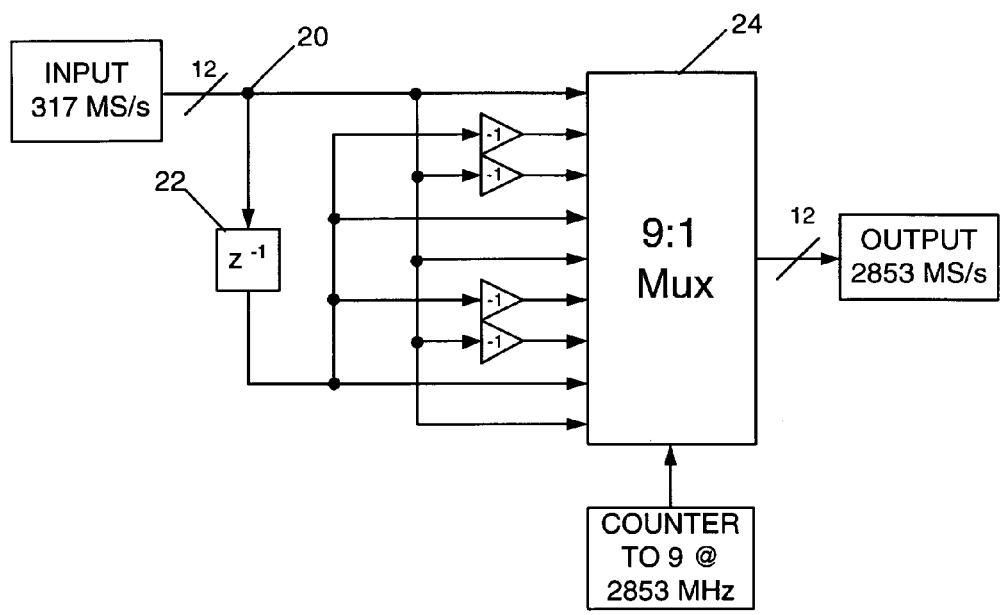
FIG. 2 is a block diagram of the digital upsampler shown in FIG. 1.
Figure 5:
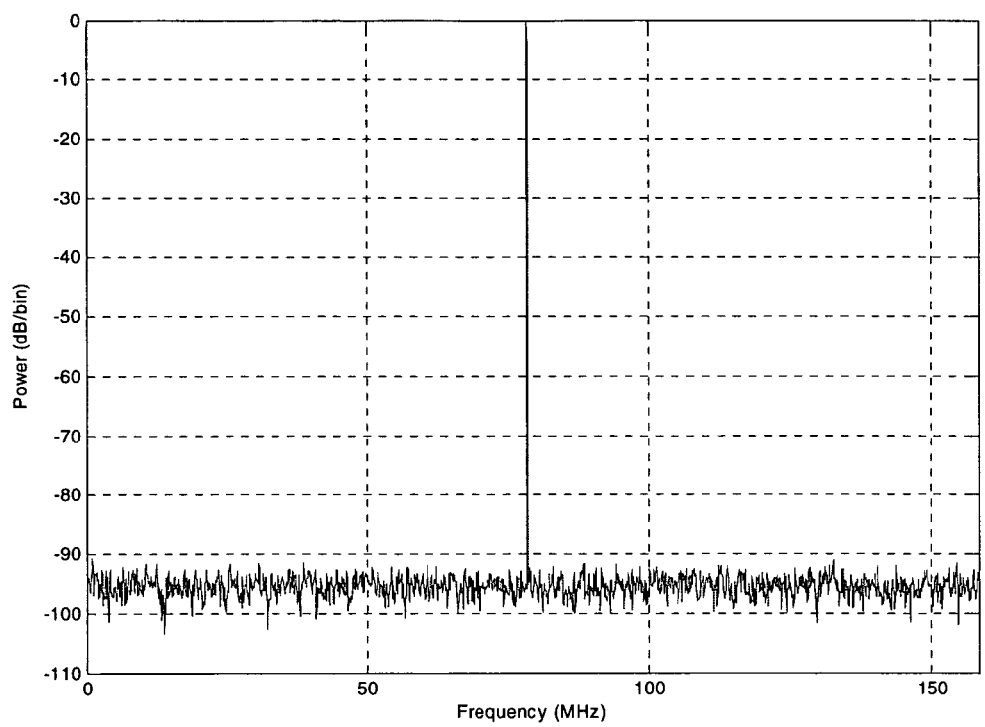
FIG. 5 is a graph depicting the upsampler input spectrum.

It will be observed that the upsampler of FIG. 2 uses two samples at its input to computer every nine output samples. If two consecutive input samples are named A and B, where A is the "newer" sample of the two, after one clock cycle, A becomes the older sample and a newer sample takes its place. Thus, A and B are always two consecutive samples at the input data rate. The effect of the logic connecting the A and B inputs to the multiplexer 24 is to arrange the input samples in the following order: A, −B, −A, B, A, −B, −A, B, A. It can be shown that this is equivalent to inserting eight zeros between consecutive input samples and filtering with a 17-tap frequency impulse response (FIR) filter that has an impulse response of 1, 0, −1, 0, 1, 0, −1, 0, 1, 0, −1, 0, 1, 0, −1, 0, 1. The frequency response of this filter has bandpass sin(x)/x response, also known as a sinc response. A typical upsampler input spectrum is shown in FIG. 5. A spectral peak is shown as occurring at approximately 79.24 MHz, which is one-fourth of the input sample rate. Inserting any even number of zeros between samples will force an image of the original spectrum to end up at the quarter sample rate for the output. This becomes the new desired signal. The FIR filter is a bandpass filter, centered a the output quarter sample rate, to retain the desired signal and remove all other images.

Figure 6:
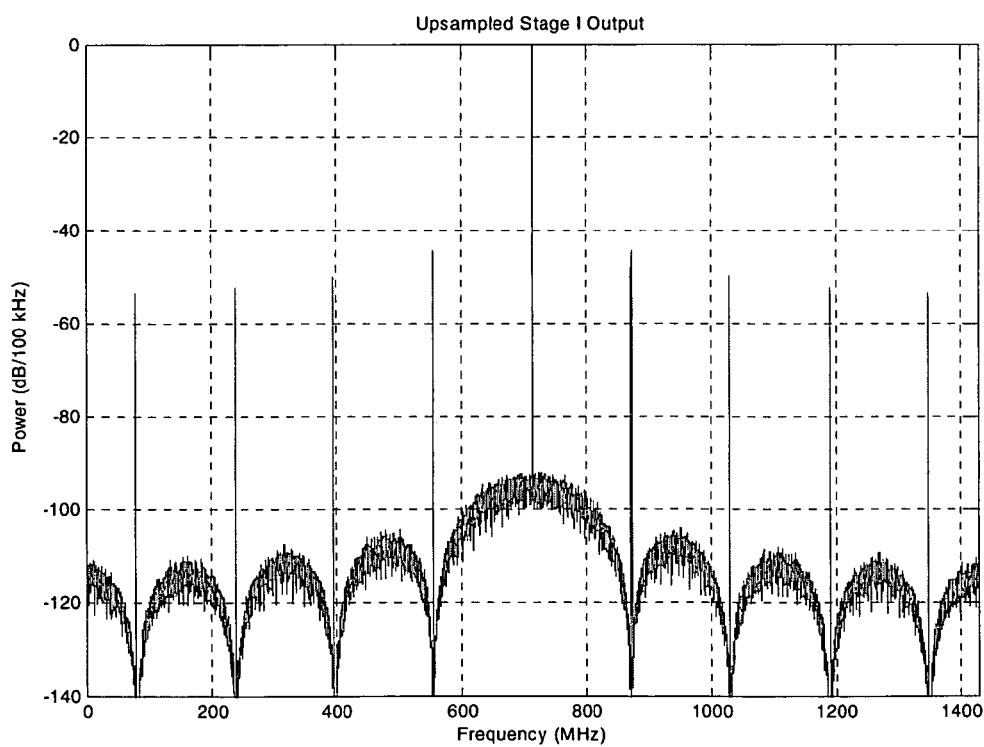
FIG. 6 is a graph depicting the upsampler output and modulator input spectrum.
Figure 7:
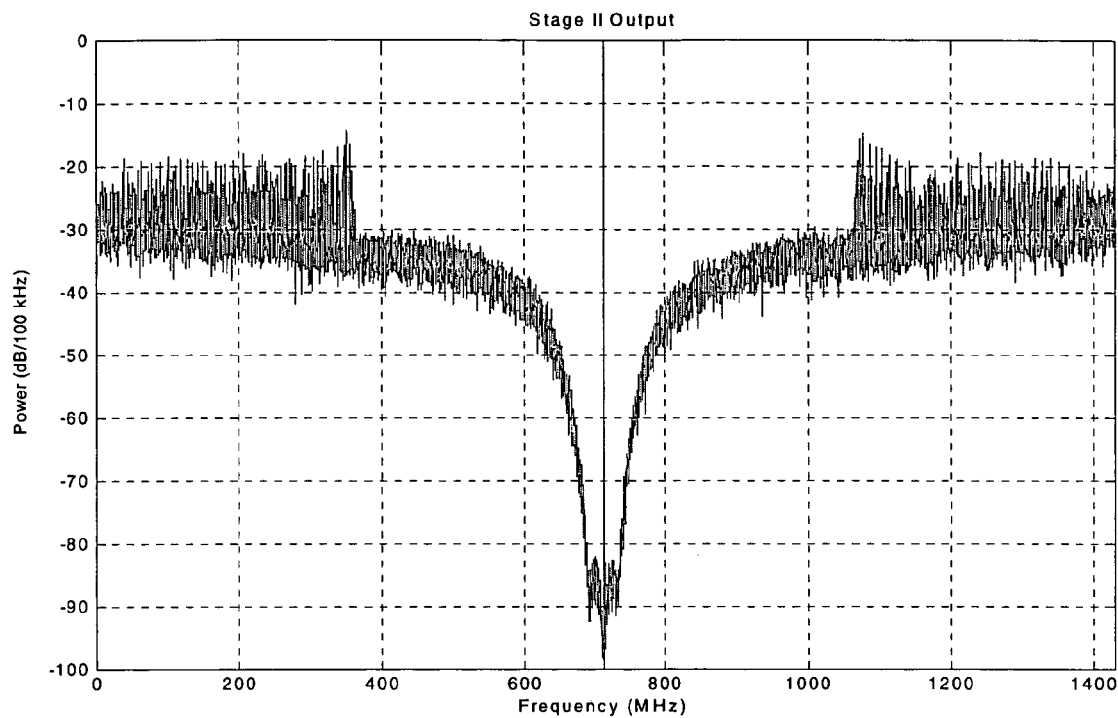
FIG. 7 is a graph depicting the modulator output spectrum.
Figure 8:
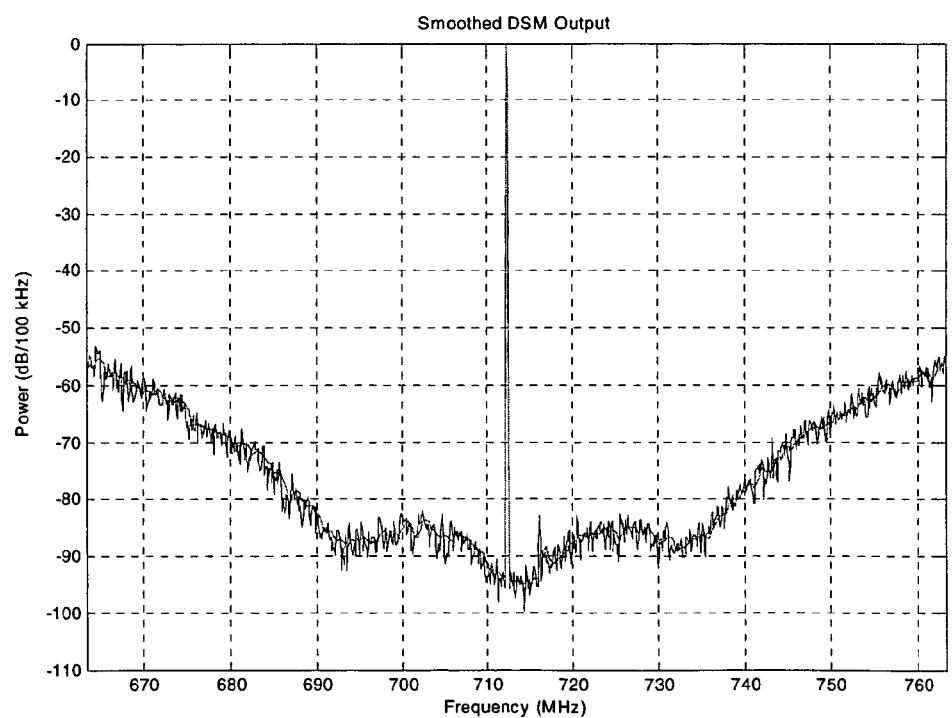
FIG. 8 is a graph depicting the modulator output spectrum over a narrower frequency band than in the FIG. 7 graph.

FIG. 6 depicts the output spectrum of the upsampler 10. The central spectral peak is at 713.25 MHz, or nine times the frequency of the spectral peak in the upsampler input spectrum. FIGS. 7 and 8 depict the output spectrum of the delta-sigma modulator 12, showing a spectral peak at the same frequency as the input spectral peak.

Figure 3:
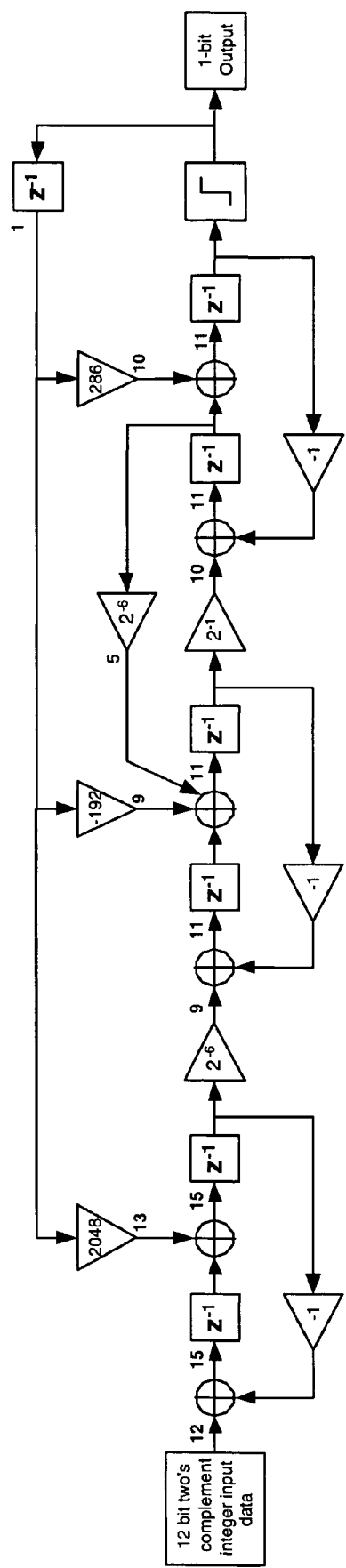
FIG. 3 is a block diagram of the delta-sigma modulator shown in FIG. 1.

The delta-sigma modulator 12 is shown in block diagram form in FIG. 3 as reducing the data sample resolution from 12-bit samples to 1-bit output samples. The modulator includes multiple digital adders (shown as circles), one-sample delay circuits (shown as squares with the enclosed notation $z^{-1}$), and digital multipliers (shown as triangles with an enclosed multiplier coefficients). Following conventional notation, the numerical quantities adjacent each signal path indicate the number of bits of resolution of the signals traversing the respective paths. Using well known principles of delta-sigma modulator design, the modulator 12 performs its function by arithmetically combining each input sample by performing summing and differencing operations that manipulate the input sample, delayed and stored previous samples, and products of previous samples and selected numerical coefficients. The final operation in the modulator is performed by a thresholding circuit, which produces a 1-bit output for conversion by the DAC 14.

The theory of operation of delta-sigma modulators is well known and will not be described here. What is important to the present invention is that some of the digital addition and digital multiplication operations that must be performed are time critical, in the sense that they potentially limit the overall speed of operation of the circuit and may preclude its operation on signals of a desired frequency. The present invention addresses this concern with respect both to multipliers and to critical adders in the modulator.

In an important aspect of the invention, adding multiples of numerical coefficients to other digital quantities is facilitated by structuring the modulator to employ coefficients that result in very rapid numerical operations. In particular, the modulator employs feedback coefficients have values of 2048, −192 and 286, respectively. The absolute values of these numbers are represented in binary notation as 100000000000, 11000000 and 100011110, respectively. It will be observed from FIG. 3 that these coefficients are multiplied by the 1-bit output from the modulator and the result is applied to an input of an adder. Clearly, the addition or subtraction of the coefficient 2048 or 192 is simplified because only the first one or two bits have a value 1 and remainder have a value 0. Negative numbers may be represented using conventional twos-complement notation. If a positive number has only a few 1 bits, the corresponding twos-complement negative number will also have only a few 1 bits. For example −192 in 11-bit binary notation may be represented as 11101000000, because the twos-complement is formed by taking the ones-complement (reversing 1s and 0s) then adding 1 to the result.

The modulator of FIG. 3 also includes a local feedback coefficient of $2^{-6}$, which is simply accomplished with a right shift of six binary places and appropriate truncation. The result of this multiplication is a third input to an adder that includes as input a quantity multiplied by the −192 coefficient. An adder of this type would normally be a three-input adder, but since the binary value of −192 has only high order bits and the binary value of a number right shifted six places has only low order bits, the sum can be formed by concatenation.

Figure 4B:
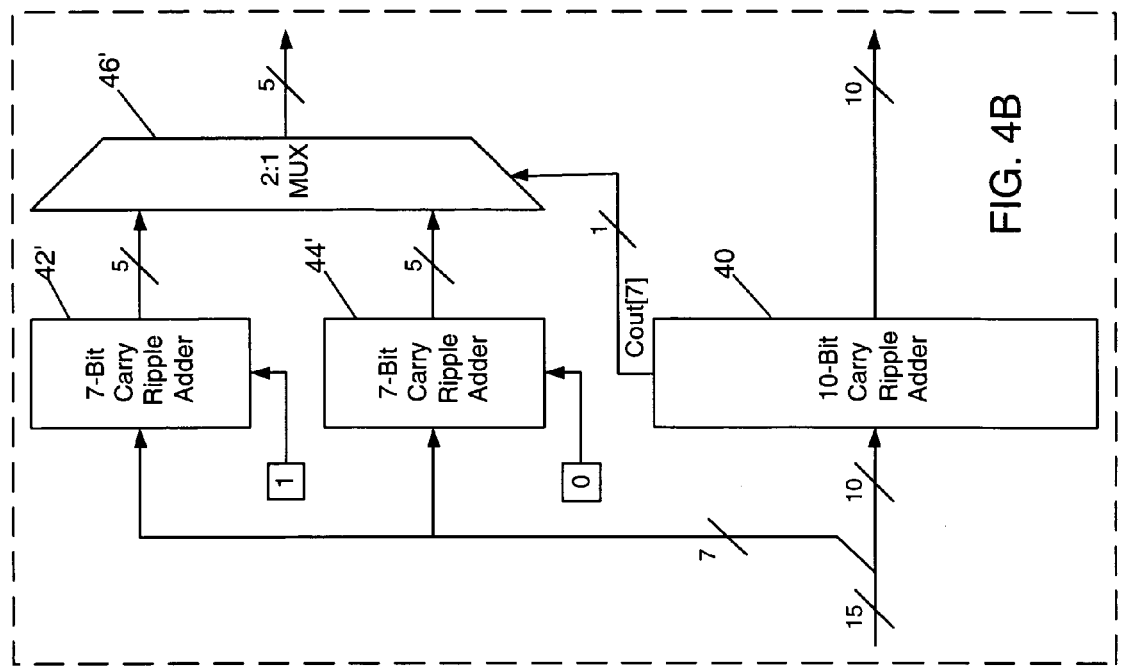
FIG. 4B is a block diagram of a carry-select 15-bit adder used in the delta-sigma modulator of FIG. 3.
Figure 4A:
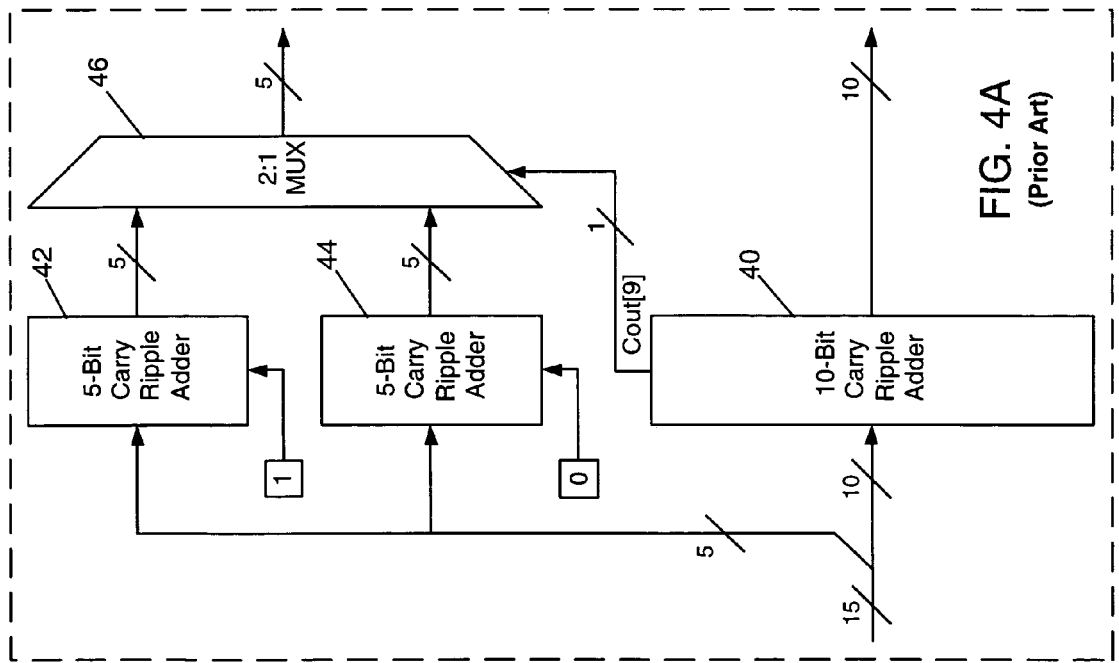
FIG. 4A is a block diagram of a prior art carry-select 15-bit adder.

The first adder at the input of a delta-sigma modulator is often a performance limiting factor because it must process samples with greater numbers of bits, which necessarily impacts on the speed of the adder. Most adders are of the carry ripple type, which simply means that the addition is performed in much the same way as one would add multi-digit numbers on paper. The least significant numbers are first added together and any resulting carry is added into the next most significant column, and so forth. In binary addition, the carry bits "ripple" across the adder from least significant to most significant bits. The greater the precision of the numbers being added, the longer it takes for the carry to ripple across the full word width. FIG. 4A depicts a prior art technique, referred to as a carry-select adder, which uses parallel processing to shorten the time of a full carry ripple. For a 15-bit adder, the operation is shared by a 10-bit carry ripple adder 40 and two 5-bit carry ripple adders 42 and 44. The ten least significant bits are added in the 10-bit adder 40. At the same time, the five most significant bits are added in both of the 5-bit adders 42 and 44. One 5-bit adder 42 assumes a carry of 0 from the 10-bit adder 40 and the other 5-bit adder 44 assumes a carry of 1 from the 10-bit adder. The two five-bit adders 42 and 44 complete their tasks before the 10-bit adder 40 has finished, and input their alternative results to a 2:1 multiplexer 46. When the 10-bit addition is complete, the value of the carry from the most significant bit, to be rippled to the next five bits is, of course, determined. This value (1 or 0) is used to control the multiplexer 46 and to select the correct input and provide the upper five bits of the total 15-bit result.

Although the technique illustrated in FIG. 4A achieves a speed advantage over a 15-bit carry ripple adder, it incurs a delay caused by operation of the multiplexer 46. In accordance with another aspect of the invention, a 15-bit adder is implemented as a modification of the carry-select adder of FIG. 4A. As shown in FIG. 4B, instead of two 5-bit adders, the invention uses two 7-bit adders 42' and 44', also operating in parallel and with carry inputs assumed to be 0 and 1, respectively. The multiplexer 46' is controlled not by the carry output from the most significant bit position of the 10-bit adder 40, but from a bit position that is two bit positions lower. Therefore, the multiplexer 46' is controlled to provide the appropriate output some time before the 10-bit adder 40 completes operation, and the entire 15-bit result is available as soon as the 10-bit adder produces its output. With this minor modification, the larger word width front-end adder at the delta-sigma modulator input can operate fast enough to in operations up to 3 GHz. The second adder in the loop is also a 15-bit adder, but does not require this modification because one of the quantities being added is the coefficient 2048, which, as discussed above, requires addition in only a few bit positions. Therefore, the add operation can be implemented in a truncated form, ignoring the effect of most of the bits in the coefficient.

It will be appreciated from the foregoing that the present invention represents a significant advance in the direct-to-RF digital-to-analog conversion. In particular, the invention may be implemented as an integrated circuit, including an upsampler and a single delta-sigma modulator that produces a one-bit output for conversion to analog form. Moreover, the modulator is operable at high frequencies by careful selection of feedback coefficients and by means of a modified carry-select adder to perform a first 15-bit add function at the input to the modulator. It will also be appreciated that although a specific embodiment of the invention has been illustrated and described in detail, various modifications may be made without departing from the spirit and scope of the invention. Accordingly, the invention should not be limited except as by the appended claims.

The invention claimed is:

1. Apparatus for converting digital input signals directly to a radio-frequency (RF) analog signal for transmission, without use of RF upconversion, the apparatus comprising:
   an upsampler, for taking the digital input signals at input sample rate and converting them by interpolation to upsampled digital input signals at a sample rate of N times the sample rate, where the sample rate of the upsampled digital input signals is greater than the input sample rate, the upsampler comprising:
      a multiplexer having N inputs and a single output;
      combinatorial logic for manipulating two consecutive digital input signals and applying selected positive or negative versions of the two consecutive signals to the N inputs of the multiplexer; and
      a counter coupled to the multiplexer and configured to generate cyclically control signals of values 1 through N, at a rate N times the input sample rate, wherein the multiplexer outputs a succession of upsampled digital signals selected from each multiplexer input in turn, at a rate of N times the input sample rate;
   a delta-sigma modulator for receiving the upsampled digital input signals and transforming them to output digital signals having a lower resolution than the digital input signals; and
   a digital-to-analog converter, for converting the output digital signals to RF analog form for transmission.

2. Apparatus as defined in claim 1, wherein the combinatorial logic has the effect of inserting (N−1) zero-valued new samples between each two consecutive digital input signals, and subsequently filtering the resulting signal stream to provide the upsampled digital input signals.

3. Apparatus as defined in claim 1, wherein the delta-sigma modulator comprises:
   a plurality of adders;
   a plurality of sample delay circuits; and
   a plurality of feedback paths that include numerical coefficients as multipliers;
   wherein at least some of the numerical coefficients are selected because binary representations of the coefficients have configurations that greatly simplify digital multiplication by these coefficients.

4. Apparatus as defined in claim 3, wherein at least one of the plurality of adders comprises:
   a first carry ripple adder that handles a first segment of n bits of digital quantities being added;
   second and third carry ripple adders that both handle, in parallel, a second segment of m bits of the digital quantities being added, where n+m is greater than B, the total number of bits in each digital quantity being added, and where the second and third carry ripple adders have 0 and 1 carry input bits, respectively; and
   a multiplexer with two inputs for receiving respective outputs in (B-n) bit positions from the second and third carry ripple adders, and with a control input for receiving a control signal derived from a carry value generated at the $(B-m)^{th}$ bit position of the first carry ripple adder;
   wherein the multiplexer selects the appropriate one of the second or third carry ripple adder outputs in the (B-n) bit positions, and this output is combined with the n-bit output of the first carry ripple adder as soon as it becomes available and without being subject to a multiplexer delay.

5. Apparatus as defined in claim 4, wherein:
   the at least one adder is a 15-bit adder (B=15);
   the first carry ripple adder handles a segment of 10 bits (n=10);
   the second and third carry ripple adders each handle a segment of 7 bits (m=7) and output the five (B-n) most significant bits to the multiplexer;
   the multiplexer is controlled by a carry signal from the $8^{th}$ or $(B-m)^{th}$ bit position of the first carry ripple adder, which selects the multiplexer output two bit cycles before the first carry ripple adder completes its 10-bit add operation, thereby allowing the multiplexer to operate with injecting a delay in the add operation.

6. A method for converting digital input signals directly to a radio-frequency (RF) analog signal for transmission, without use of RF upconversion, the method comprising:
   upsampling the digital input signals by converting them from input sample rate to upsampled digital input signals at a rate greater than the input sample rate, the rate greater than the input sample rate being N times the input sample rate, the step of upsampling the digital input signals comprising:
      providing a multiplexer having N inputs and a single output;
      manipulating two consecutive digital input signals and applying selected positive or negative versions of the two consecutive signals to the N inputs of the multiplexer; and
      cyclically generating, in a counter coupled to the multiplexer, control signals of values 1 through N, at a rate N times the input sample rate, wherein the multiplexer outputs a succession of upsampled digital signals selected from each multiplexer input in turn, at a rate of N times the input sample rate; and
   in a delta-sigma modulator, receiving the upsampled digital input signals and transforming them to output digital signals having a lower resolution than the digital input signals; and
   converting the output digital signals to RF analog form for transmission.

7. A method as defined in claim 6, wherein the manipulating step has the effect of inserting (N−1) zero-valued new samples between each two consecutive digital input signals, and subsequently filtering the resulting signal stream to provide the upsampled digital input signals.

8. A method as defined in claim 6, wherein the step of transforming the upsampled digital input signals in the delta-sigma modulator comprises:
  performing a plurality of add operation in adders;
  performing a plurality of sample delay operations in sample delay circuits; and
  providing a plurality of feedback paths that include numerical coefficients as multipliers;
  wherein at least some of the numerical coefficients are selected because binary representations of the coefficients have configurations that greatly simplify digital multiplication by these coefficients.

9. A method as defined in claim 8, wherein at least one of add operations comprises:
  adding first segments of n bits of digital quantities being added in a first carry ripple adder;
  in second and third carry ripple adders, adding in parallel, second segments of m bits of the digital quantities being added, where n+m is greater than B, the total number of bits in each digital quantity being added, and where the second and third carry ripple adders have 0 and 1 carry input bits, respectively;
  receiving as two inputs to a multiplexer, respective outputs in (B-n) bit positions from the second and third carry ripple adders, and receiving as a control input to the multiplexer signal derived from a carry value generated at the $(B-m)^{th}$ bit position of the first carry ripple adder;
  wherein the multiplexer selects the appropriate one of the second or third carry ripple adder outputs in the (B-n) bit positions, and this output is combined with the n-bit output of the first carry ripple adder as soon as it becomes available and without being subject to a multiplexer delay.

10. A method as defined in claim 9, wherein:
  the at least one add operation is a 15-bit operation (B=15);
  the first carry ripple adder handles a segment of 10 bits (n=10);
  the second and third carry ripple adders each handle a segment of 7 bits (m=7) and output the five (B-n) most significant bits to the multiplexer;
  the multiplexer is controlled by a carry signal from $8^{th}$ or $(B-m)^{th}$ bit position of the first carry ripple adder, which selects the multiplexer output two bit cycles before the first carry ripple adder completes its 10-bit add operation, thereby allowing the multiplexer to operate with injecting a delay in the add operation.

11. Apparatus for converting digital input signals directly to a radio-frequency (RF) analog signal for transmission, without use of RF upconversion, the apparatus comprising:
  an upsampler, for taking the digital input signals at input sample rate and converting them by interpolation to upsampled digital input signals at a rate of N times the sample rate, where the sample rate of the upsampled digital input signals is greater than the input sample rate;
  a delta-sigma modulator for receiving the upsampled digital input signals and transforming them to output digital signals having a lower resolution than the digital input signals, the delta-sigma modulator comprising:
    a plurality of adders, at least one of the plurality of adders comprising a first carry ripple adder that handles a first segment of n bits of digital quantities being added, second and third carry ripple adders that both handle, in parallel, a second segment of m bits of the digital quantities being added, where n+m is greater than B, the total number of bits in each digital quantity being added, and where the second and third carry ripple adders have 0 and 1 carry input bits, respectively, and a multiplexer with two inputs for receiving respective outputs in (B-n) bit positions from the second and third carry ripple adders, and with a control input for receiving a control signal derived from a carry value generated at the $(B-m)^{th}$ bit position of the first carry ripple adder, wherein the multiplexer selects the appropriate one of the second or third carry ripple adder outputs in the (B-n) bit positions, and this output is combined with the n-bit output of the first carry ripple adder as soon as it becomes available and without being subject to a multiplexer delay;
    a plurality of sample delay circuits; and
    a plurality of feedback paths that include numerical coefficients as multipliers;
    wherein at least some of the numerical coefficients are selected because binary representations of the coefficients have configurations that greatly simplify digital multiplication by these coefficients; and
  a digital-to-analog converter, for converting the output digital signals to RF analog form for transmission.

12. The apparatus defined in claim 11, wherein:
  the at least one adder is a 15-bit adder (B=15);
  the first carry ripple adder handles a segment of 10 bits (n=10);
  the second and third carry ripple adders each handle a segment of 7 bits (m=7) and output the five (B-n) most significant bits to the multiplexer;
  the multiplexer is controlled by a carry signal from the $8^{th}$ or $(B-m)^{th}$ bit position of the first carry ripple adder, which selects the multiplexer output two bit cycles before the first carry ripple adder completes its 10-bit add operation, thereby allowing the multiplexer to operate with injecting a delay in the add operation.

13. The apparatus defined in claim 12 wherein the upsampler generates upsampled digital signals at a sample rate of N times the input sample rate.

14. The apparatus defined in claim 13, wherein the upsampler comprises:
  a multiplexer having N inputs and a single output;
  combinatorial logic for manipulating two consecutive digital input signals and applying selected positive or negative versions of the two consecutive signals to the N inputs of the multiplexer; and
  a counter coupled to the multiplexer and configured to generate cyclically control signals of values 1 through N, at a rate N times the input sample rate, wherein the multiplexer outputs a succession of upsampled digital signals selected from each multiplexer input in turn, at a rate of N times the input sample rate.

15. The apparatus defined in claim 14, wherein the combinatorial logic has the effect of inserting (N−1) zero-valued new samples between each two consecutive digital input signals, and subsequently filtering the resulting signal stream to provide the upsampled digital input signals.

* * * * *